(12) United States Patent
Okita (10) Patent No.: US 6,411,650 B1
(45) Date of Patent: Jun. 25, 2002

(54) PLL CONTROL METHOD IN DATA RECEIVING APPARATUS

(75) Inventor: Ryoji Okita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/192,429

(22) Filed: Nov. 16, 1998

(30) Foreign Application Priority Data

May 28, 1998 (JP) ............................................ 10-147354

(51) Int. Cl.[7] .............................. H03H 7/30; H03H 7/40; H03H 5/159
(52) U.S. Cl. ........................................ 375/232; 708/323
(58) Field of Search .................................. 375/229, 230, 375/231, 232, 326, 327, 339, 355, 371, 376, 344, 346, 348, 350; 708/300, 301, 323; 333/28 R; 329/307, 308

(56) References Cited

U.S. PATENT DOCUMENTS 4,607,230 A * 8/1986 Kaku et al.
4,694,469 A * 9/1987 Kaku et al.

FOREIGN PATENT DOCUMENTS

JP 408335962 A * 12/1996

* cited by examiner

*Primary Examiner*—Jean Corrielus
(74) *Attorney, Agent, or Firm*—Arent, Fox, Kintner, Plotkin & Kahn PLLC (57) ABSTRACT

Disclosed is a PLL control method of controlling a phase of a PLL for taking synchronism of a receiving signal in a data receiving apparatus. The phase of the PLL is synchronized with a phase when training irrespective of a line characteristic. The PLL control method comprises a step of training a timing phase of PLL in accordance with a training signal, a step of obtaining, immediately after training, a right-side reference value from a sum of tap coefficients of taps on the right side of a center tap of the auto equalization unit, and obtaining a left-side reference value from a sum of tap coefficients of taps on the left side of the center tap of said auto equalization unit, a step of calculating a sum of the tap coefficients of the taps on the right side of the center tap of the auto equalization unit, thereafter obtaining a first difference between the above sum and a right-side reference value, calculating a sum of the tap coefficients of the taps on the left side of the center tap of the auto equalization unit, and thereafter obtaining a second difference between the above sum and a left-side reference value, and a step of obtaining a PLL control signal by obtaining a difference between the first and second differences.

11 Claims, 11 Drawing Sheets

| | Center TAP determination | | |
|---|---|---|---|
| Center = | T44 | T45 | T46 |
| Status after traning |  |  |  |
| Judge condition | $C44 \geq 2*C46$ | $C44 < 2*C46$ AND $2*C44 > C46$ | $2*C44 \leq C46$ |

Nyquist frequency

FIG. 10
PRIOR ART

Nyquist frequency

PLL CONTROL METHOD IN DATA RECEIVING APPARATUS

BACKGROUND OF THE INVENTION

1. Field of the Invention

The present invention relates generally to a PLL control method of controlling a phase of a clock of a PLL (Phase Locked Loop) for taking synchronism of a receiving signal in a data receiving apparatus such as MODEM etc and, more particularly, to a PLL control method for obtaining a PLL control signal by making use of a tap coefficient of an auto equalizer.

2. Description of the Related Art

A MODEM (modulator-demodulator) is widely utilized in a data communications network using lines. In this type of MODEM, it is necessary for stable data communications to generate a PLL clock for taking the synchronism of a receiving signal.

Figure 9:
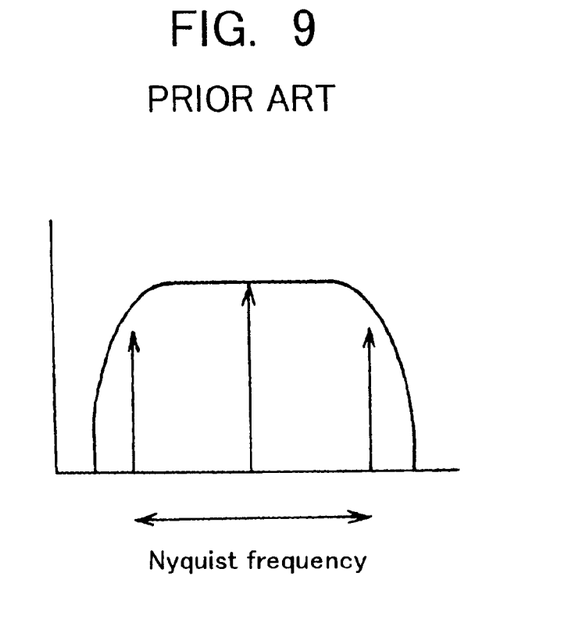
FIG. 9 is a diagram showing a spectrum in a Nyquist transmission.
Figure 10:
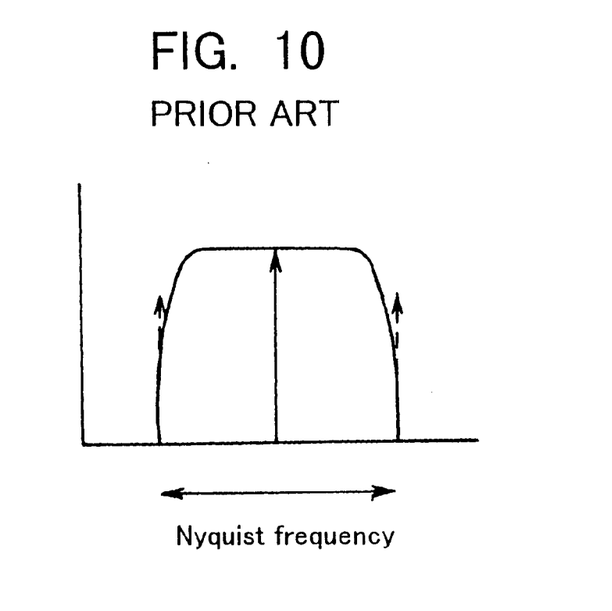
FIG. 10 is a diagram showing a spectrum in a non-Nyquist transmission.
Figure 11:
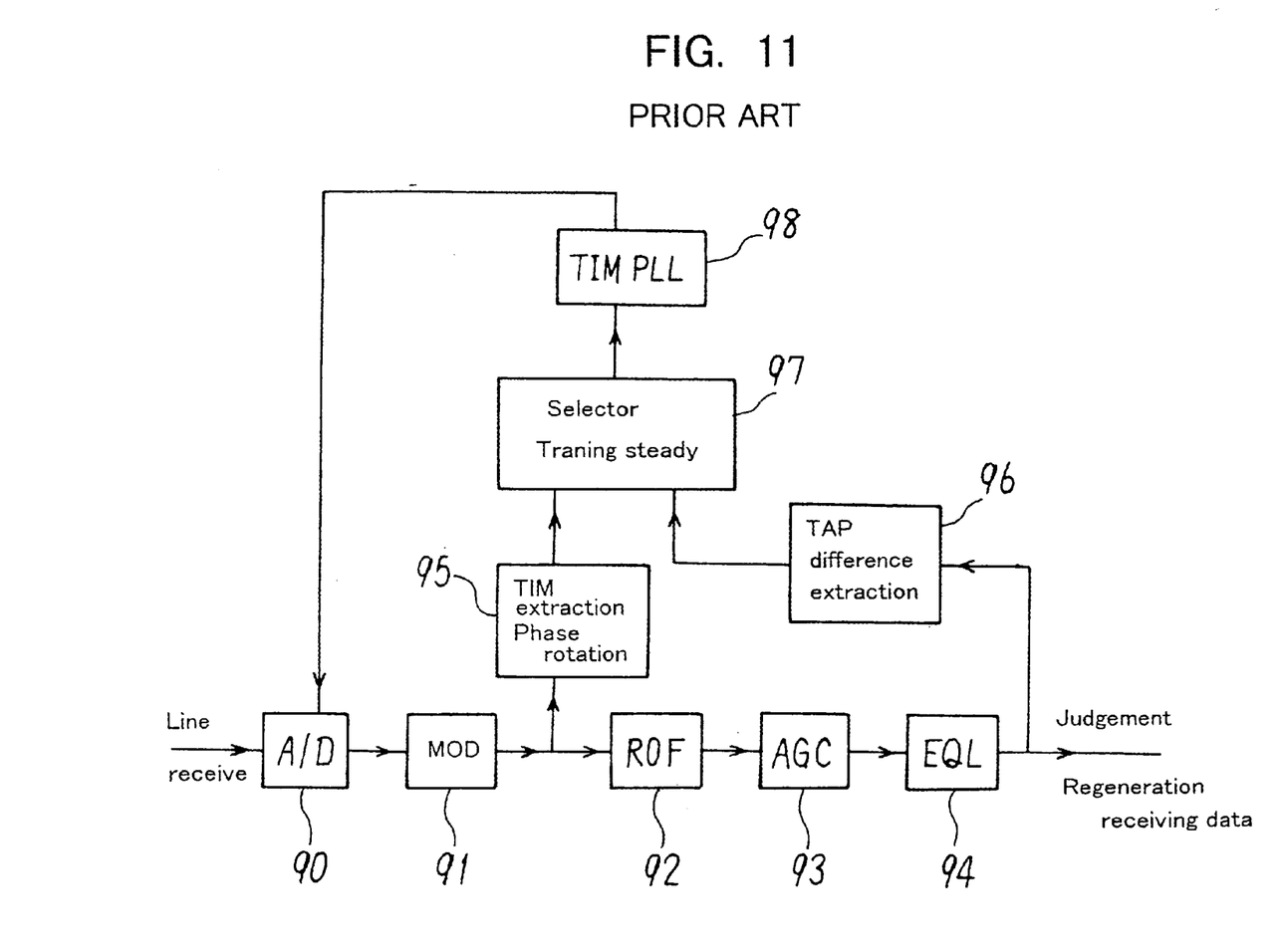
FIG. 11 is a diagram showing a construction in the prior art.
Figure 12A:
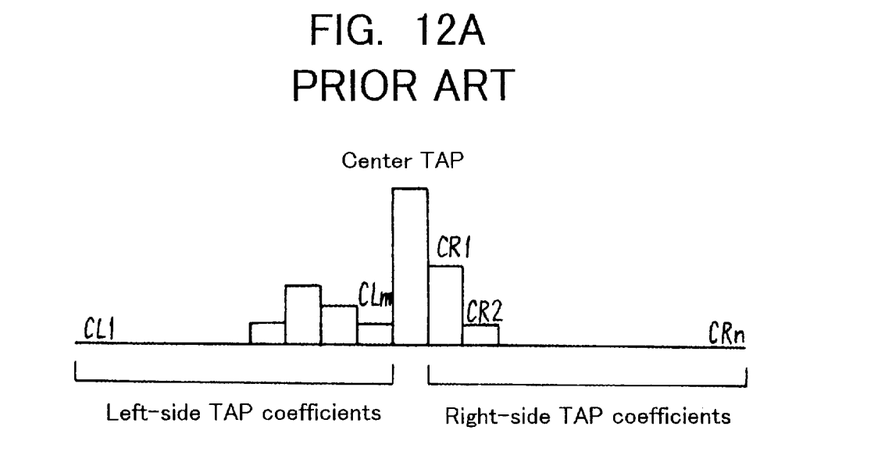
FIGS. 12A, 12B and 12C are explanatory diagrams showing the prior art.
Figure 12B:
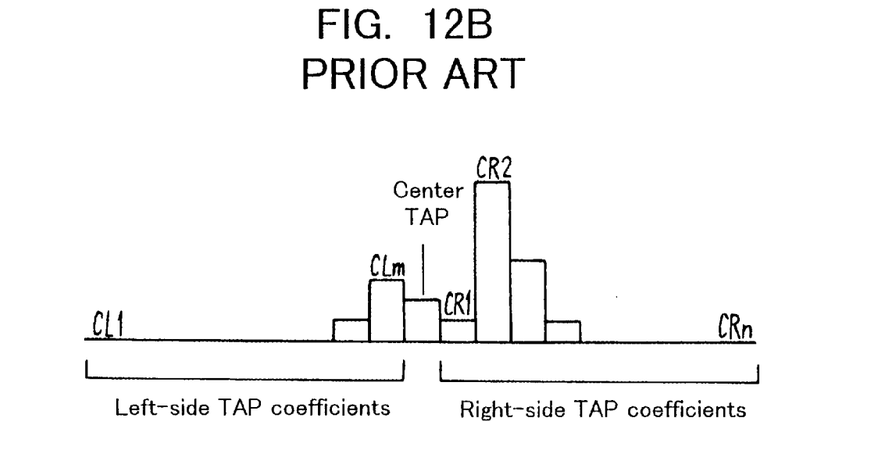
Figure 12C:
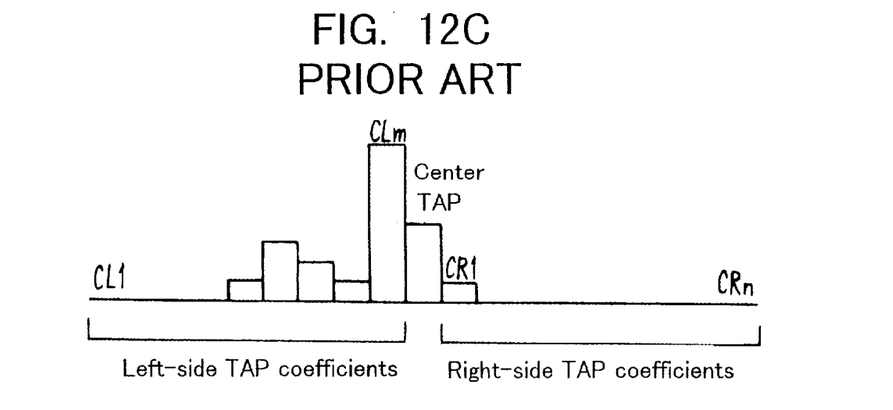

FIG. 9 is a diagram showing a spectrum in a Nyquist transmission. FIG. 10 is a diagram showing a spectrum in a non-Nyquist transmission. FIG. 11 is a diagram illustrating a construction in the prior art. FIGS. 12A–12C are explanatory diagrams each showing the prior art.

According to the prior art PLL control method in the MODEM, a timing phase component is extracted from a receiving carrier in steady-state communications after an end of training, and a PLL control signal is obtained. This PLL control method is, in the case of a Nyquist transmission system, because of an existence of a Nyquist frequency, capable of easily extracting the timing phase from the receiving carrier.

Namely, as shown in the spectrum diagram of FIG. 9 illustrating a frequency distribution in the Nyquist transmission, a Nyquist transmission method is a method of transmitting at a Nyquist interval signal points disposed on at the Nyquist interval (a Nyquist frequency) on the time-axis. According to the Nyquist transmission method, the signal points can be transmitted without any inter-symbol interference with other signal points.

Incidentally, some of the MODEMs recently proposed have a transmission speed as high as, e.g., 28.8 kbps. These MODEMs adopt a non-Nyquist transmission method without using the Nyquist transmission method.

As shown in the spectrum diagram of FIG. 10 illustrating a frequency distribution in the non-Nyquist transmission, the non-Nyquist transmission method is a method of transmitting at the Nyquist interval the signal points disposed between the two Nyquist intervals on the time-axis. According to the non-Nyquist transmission method, the signal points are transmitted having the inter-symbol interference with other signal points.

In the thus structured non-Nyquist transmission method, there exists no Nyquist frequency, and hence it is difficult to extract the timing component.

Further, a phase delay distortion might occur in the signal because of being transmitted via a carrier link depending on the line through which the signal is transmitted. it is therefore difficult to extract a timing phase.

Thus, in the case of using the non-Nyquist transmission method and in the steady state, the extraction of the timing component from the receiving carrier becomes difficult depending on the state of the line. Consequently, the PLL becomes unstable, and there might be induced a deterioration of performance such as an increase in error rate of the MODEM.

There is proposed a method of obtaining a stable PLL control signal without using the above timing extracting method in the steady state (Japanese Patent Application Laid-Open Publication No.8-335962). This method is explained with reference to FIGS. 11 and 12A through 12C.

FIG. 11 is a diagram showing a construction of a receiving unit of a MODEM. As shown in FIG. 11, an analog signal (a receiving signal) received via the line is converted by an analog/digital converter 90 into a digital signal. The digital signal outputted from the A/D converter 90 is demodulated by a demodulation unit 91.

An output from the demodulation unit 91 is waveform-shaped by a roll-off filter (ROF) 92. An output of the roll-off filter 92 is subjected to auto gain control in an auto gain control unit (AGC) 93 and is thereafter waveform-shaped by an auto equalization unit (EQL) 94. Then, an output of the auto equalization is inputted to an unillustrated judging unit, whereby receiving data is regenerated.

On the other hand, on the occasion of transmitting the data, before transmitting the data, training data having a predetermined pattern is to be transmitted. A receiving apparatus demodulates this item of training data, and executes an initializing process of each unit. Herein, a timing extraction/phase rotational quantity calculating unit 95 extracts the timing component in the training signal transmitted anterior to the data signal, and calculates a phase rotational quantity of the timing component.

A selection unit 97 selects this phase rotational quantity as a PLL control signal during the training period. With this selection, during the training period, the timing PLL unit (TIM PLL) 98 is phase-controlled by the timing phase of the training signal.

Namely, the timing PLL unit 98 controls a phase of an internal clock so that the phase rotational quantity is zeroed. This phase-controlled sampling signal (the clock) is outputted to the A/D converter 90. The phase of the sampling signal is thereby synchronized with the phase of the training signal.

During data communications (a steady state) subsequent to the training period, as described above, it is difficult to extract a timing phase component from a carrier of the receiving signal. Therefore, the PLL control signal is obtained from a tap coefficient of the auto equalization unit 94. The auto equalization unit 94 is constructed of a transversal filter to eliminate a distortion of waveform of the receiving signal due to a line distortion etc.

The auto equalization unit 94 dynamically controls the tap coefficient so as to obtain an optimal equalization characteristic suited to a line state. During the training period, the tap coefficient is initialized based on the training data. Corresponding to the line state, the tap coefficient of a center tap located at the center of a group of taps of the auto equalization unit 94, grows most, and the tap coefficients of the taps adjacent on both sides to the center tap grow to some extent corresponding to the line state. The optimal equalization characteristic at that point of time is thereby attained.

Herein, if the timing phase is synchronized therewith, the tap coefficient holds the same value as a value immediately after the training. Whereas if the timing phase is shifted, the tap coefficient set at the training time moves correspondingly in the right or left direction on the basis of the center tap.

FIG. 12A shows a distribution of the tap coefficients of the respective taps when the timing phase is synchronized. In this case, the center tap value is largest, and the right and left tap coefficients are set to values corresponding to the line state.

FIG. 12B shows a distribution of the tap coefficients of the taps when the timing phase lags. In this case, for compensating the phase lag, the tap coefficients are controlled so that the tap coefficient of the tap disposed on the right side of the center tap takes a large value, while the tap coefficient of the tap disposed on the left side of the center tap takes a small value.

FIG. 12C shows a distribution of the tap coefficients of the taps when the timing phase advances. For compensating the phase advancement, the tap coefficients are controlled so that the tap coefficient of the tap disposed on the left side of the center tap takes a large value, while the tap coefficient of the tap disposed on the right side of the center tap takes a small value.

Accordingly, the phase advancement/lag of the receiving signal can be detected corresponding to the values of the tap coefficients. Since the tap coefficients are properly set at the training time, the PLL control is conducted so that the distribution of the tap coefficients is held during the steady state as it is at the training time. Therefore, according to the prior art, there is provided a tap right-and-left difference extraction unit 96 (see FIG. 11) for taking a difference between a sum of the tap coefficients of the taps on the left side of the center tap and a sum of the tap coefficients of the taps on the right side thereof. Then, during the steady state, the selection unit 97 selects an output of the tap right-and-left difference extraction unit 96 as a PLL control input, and the timing PLL unit 98 is controlled so that the above difference is zeroed.

There arise, however, the problems inherent in the prior art.

Since there is a scatter in the line characteristic, depending on the line characteristic, the output of the tap right-and-left difference extraction unit does not become zero as the case may be immediately after training for the training. For the line exhibiting such a line characteristic, the PLL control is executed so that the tap right-and-left difference extraction output is zeroed. Hence, there exists a problem, wherein the phase is transiently shifted untill the tap right-and-left difference extraction output is zeroed immediately after training, and an unstable state occurs. The data transmission just after being led in has been unstable.

Further, even if the tap right-and-left difference extraction output does not become zero immediately after training, the PLL control is implemented so that tap right-and-left difference extraction output is zeroed. This might conduce to such a problem of being synchronized with a phase different from the timing phase when training, it is therefore difficult to attain the precise phase synchronization.

SUMMARY OF THE INVENTION

It is a primary object of the present invention to provide a PLL control method in a data receiving apparatus, of taking synchronism with a phase when training irrespectively of a line characteristic.

It is another object of the present invention to provide a PLL control method in a data receiving apparatus, of preventing an occurrence of a transiently-shifted state immediately after training irrespective of a line characteristic.

It is still another object of the present invention to provide a PLL control method in a data receiving apparatus, of attaining precise phase synchronization even by using tap coefficients irrespective of a line characteristic.

To accomplish the above objects, according to a first aspect of the present invention, a PLL control method in a data receiving apparatus including an auto equalization unit for automatically equalizing a demodulated receiving signal, comprises a step of training a timing phase of PLL in accordance with a training signal, a step of obtaining, immediately after training, a right-side reference value from a sum of tap coefficients of taps on the right side of a center tap of the auto equalization unit, and obtaining a left-side reference value from a sum of tap coefficients of taps on the left side of the center tap of the auto equalization unit, a step of calculating, after obtaining the two reference values, a first sum of the tap coefficients of the taps on the right side of the center tap of the auto equalization unit, thereafter calculating a first difference between the first sum and the right-side reference value, calculating a second sum of the tap coefficients of the taps on the left side of the center tap of the auto equalization unit, and thereafter obtaining a second difference between the second sum and the left-side reference value, and a step of obtaining a PLL control signal by obtaining a difference between the first and second differences.

According to the present invention, the sum of the right-side tap coefficients and the sum of the left-side tap coefficients just after training, are stored as the right- and left-side reference values. Thereafter, the sum of the right-side tap coefficients is calculated, then the first difference between this sum and the right-side reference value is calculated. Then, the sum of the left-side tap coefficients is calculated, and the second difference between this sum and the left-side reference value. A deviation from the phase (the reference value) immediately after timing-training can be thereby known. Then, a difference between the first and second differences is taken, thereby obtaining the PLL control signal. Therefore, a shift quantity and a shift direction are thereby obtained.

Thus, according to the present invention, the sum of the right-side tap coefficients and the sum of the leftside tap coefficients just after training, are stored as the right- and left-side reference values, and the PLL control is effected so that the difference from the reference value becomes zero. Hence, even if there is the scatter in the line characteristic, the phase can be adjusted precisely to the phase when training. Further, there is executed the PLL control to the reference value immediately after training, and it is therefore feasible to prevent an occurrence of a transiently shifted state just after training, and the stable data transmission can be carried out immediately after training.

According to a second aspect of the present invention, the step of executing the training process includes a step of extracting a timing component of the training signal, and thereafter calculating a phase rotational quantity of the timing component.

According to a third aspect of the present invention, the step of obtaining the reference values includes a step of storing the obtained right- and left-side reference values.

According to a fourth aspect of the present invention, the PLL control method further comprises a step of determining, after training, the center tap of the auto equalization unit in accordance with values of the tap coefficients of the taps of the auto equalization unit.

According to a fifth aspect of the present invention, the PLL control method further comprises a step of obtaining, after training, a timing reference value from a phase of the timing component regenerated from the receiving signal, a step of obtaining a third difference between an average value of the phase of the timing component regenerated from the receiving signal and the reference value, and a step of obtaining the PLL control signal by adding the third difference to the difference between the first and second differences.

Other features and advantages of the present invention will become readily apparent from the following description taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principle of the invention, in which.

DETAILED DESCRIPTION OF THE PREFERRED EMBODIMENTS

Figure 1:
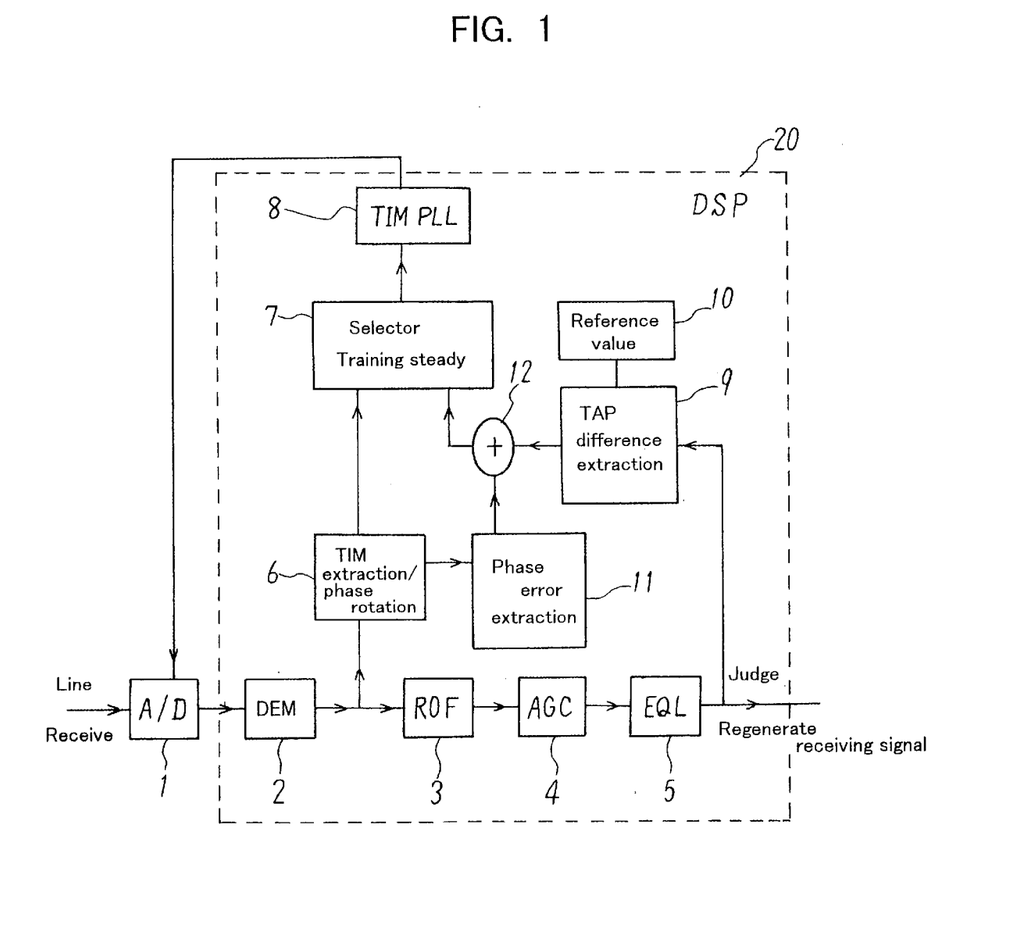
FIG. 1 is a block diagram showing one embodiment of the present invention.
Figure 2:
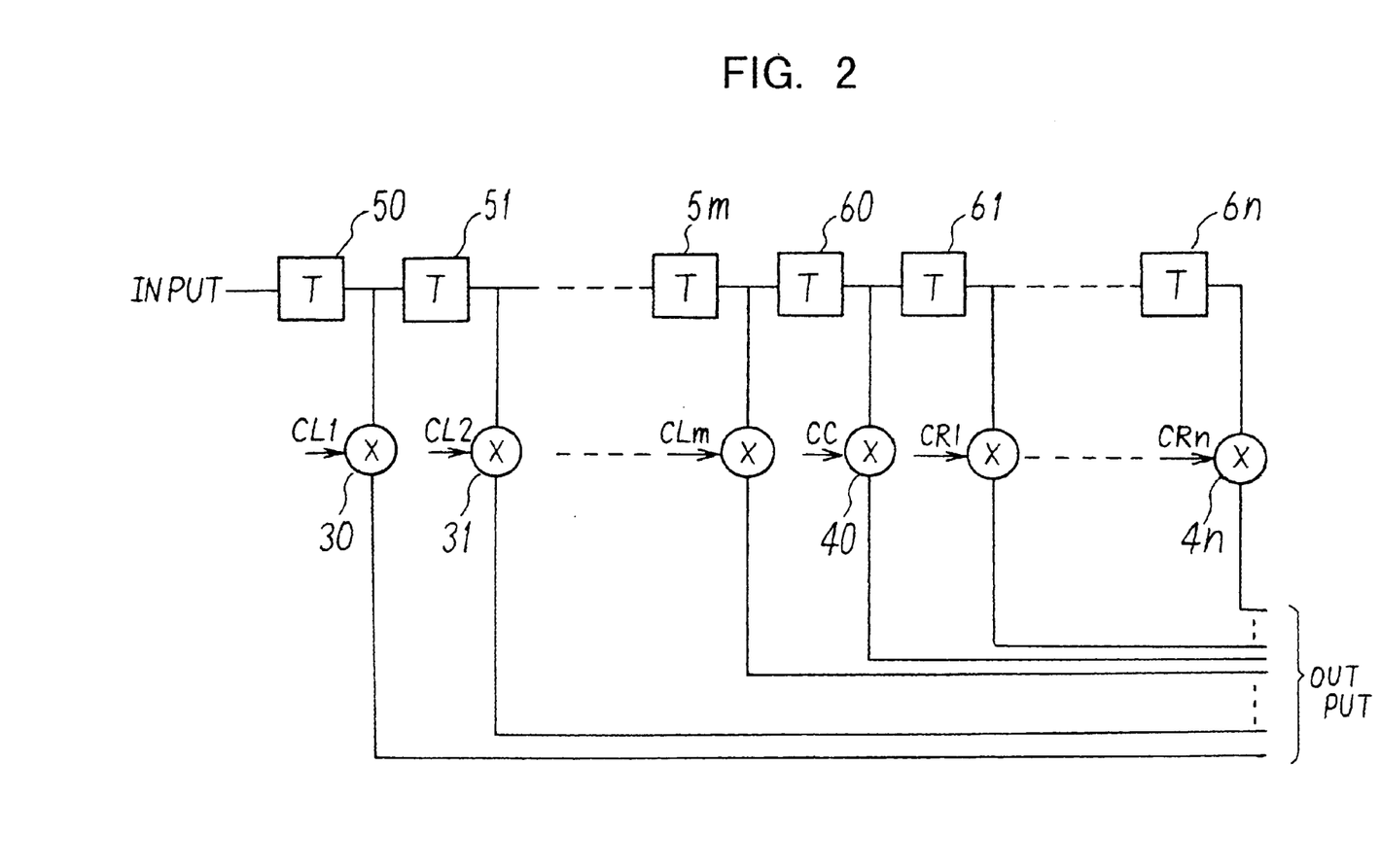
FIG. 2 is a diagram showing an equivalent circuit of an auto equalization unit shown in FIG. 1.

FIG. 1 is a block diagram showing a MODEM receiving unit in one embodiment of the present invention. FIG. 2 is a diagram showing an equivalent circuit of an auto equalization unit shown in FIG. 1.

As shown in FIG. 1, an analog/digital converter 1 converts an analog signal (a receiving signal) received via a line into a digital signal. A demodulation unit 2 demodulates the digital signal outputted from the A/D converter 1. A roll-off filter (ROF) 3 shapes a waveform of an output from the demodulation unit 2.

An auto gain control unit (AGC) 4 executes auto gain control of an output of the roll-off filter 3. An auto equalization unit (EQL) 5 equalizes a waveform of an output of the auto gain control unit 4. Then, an output of the auto equalization is inputted to an unillustrated judging unit, wherein he receiving data is regenerated.

As illustrated in the equivalent circuit diagram of the auto equalization unit, the auto equalization unit 5 is constructed of a known transversal filter. More specifically, in the auto equalization unit 5, L-pieces (L=m+n+1) of taps 50–6$n$ are connected in series. For instance, a tap group of the auto equalization unit 5 consists of 64 pieces of taps.

Multipliers 30–4$n$ multiply outputs of the respective taps 50–6$n$ by tap coefficients CL1–CLm, CC, CR1–CRn. Outputs of the multipliers are inputted to an unillustrated judging unit, in which the data are regenerated. Further, the tap coefficients CL1–CRn are updated corresponding to a judgement error in the judging unit.

Herein, the tap 60 exhibiting a maximum growth quantity of the tap coefficient of the auto equalization unit 5, is set as a center tap. A growth of a tap coefficient CC of the center tap 60 is maximized when in a steady state. The taps 61–6$n$ located on the right side of the center tap 60 are termed right taps, while the taps 50–5$m$ located on the left side of the center tap 60 are termed left taps.

Referring back to FIG. 1, a timing extraction/phase rotational quantity calculating unit 6 extracts a timing component of the receiving signal, and calculates a phase rotational quantity of the timing component. A selection unit 7 selects this phase rotational quantity as a PLL control signal during a training period. When in the steady state (during a data transmission), the selection unit 7 selects the PLL control signal from an adding unit 12 which will be mentioned later on.

A timing PLL unit (TIM PLL) 8 synchronously controls a phase of a sampling signal in accordance with the PLL control signal inputted, and outputs the sampling signal subjected to the synchronous control.

A tap difference extracting unit 9, as will be described later on, calculates a first sum $\Sigma CRn$ of the tap coefficients CR1–CRn of the right taps 61–6$n$ of the auto equalization unit 5, and a second sum $\Sigma CLm$ of the tap coefficients CL1–CLm of the left taps 50–5$m$. Then, the tap difference extracting unit 9 is, immediately after training, stored with the first sum $\Sigma CRn$ and the second sum $\Sigma CLm$ as a right-side reference vale Rr and a left-side reference value Lr.

Hereafter, the tap difference extracting unit 9 calculates a first difference (Rr–$\Sigma CRn$) between the thus calculated first sum $\Sigma CRn$ and the right-side reference value Rr. Further, the tap difference extracting unit 9 calculates a second difference (Lr–$\Sigma CLm$) between the thus calculated second sum $\Sigma CLm$ and the left-side reference value Lr. Furthermore, the tap difference extracting unit 9 calculates a difference [(Rr–$\Sigma CRn$)–(Lr–$\Sigma CLm$)] between the first difference (Rr–$\Sigma CRn$) and the second difference (Lr–$\Sigma CLm$), thereby obtaining a first PLL control signal (1).

A reference value storage unit 10 is stored with the right-side reference value Rr and the left-side reference value Lr which have been calculated immediately after training. A phase error extracting unit 11, as will hereinafter be mentioned, integrates the phase rotational quantities immediately after training, then sets an average value thereof as a reference phase, and hold it. The phase error extracting unit 11 hereinafter integrates the phase rotational quantities, calculates the average value thereof, and then calculates a third difference between the average value and the reference phase, thereby obtaining a second PLL control signal (2).

An adding unit 12 adds the first PLL control input (1) from the tap difference extracting unit 9 to the second PLL control input (2) from the phase error extracting unit 11, and outputs an added result to the selection unit 7. Note that blocks 2–12 are those into which processes executed by a digital/signal processor (DSP) 20 are blocked.

Figure 3:
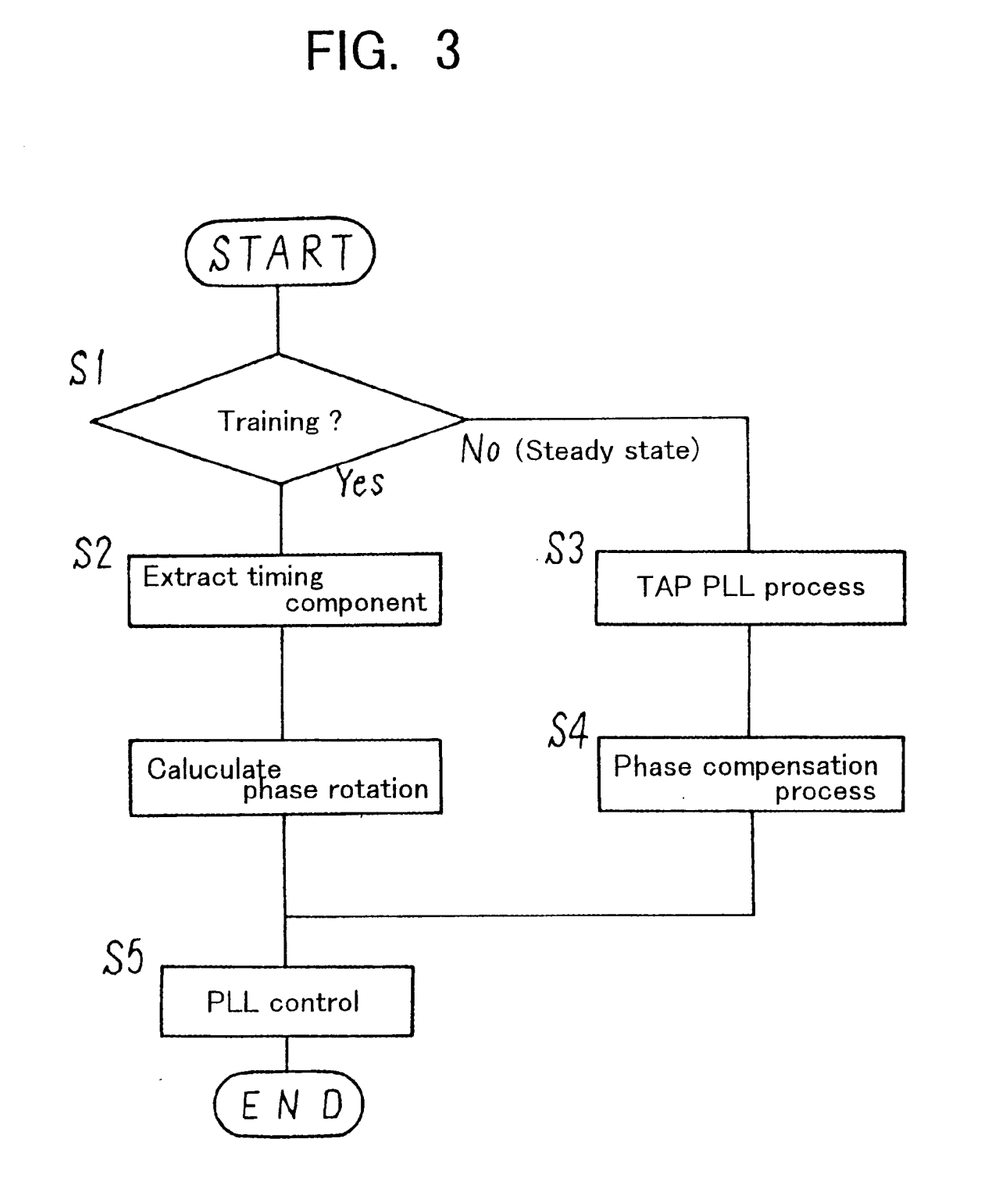
FIG. 3 is a flowchart showing a PLL control process shown in FIG. 1.
Figure 4:
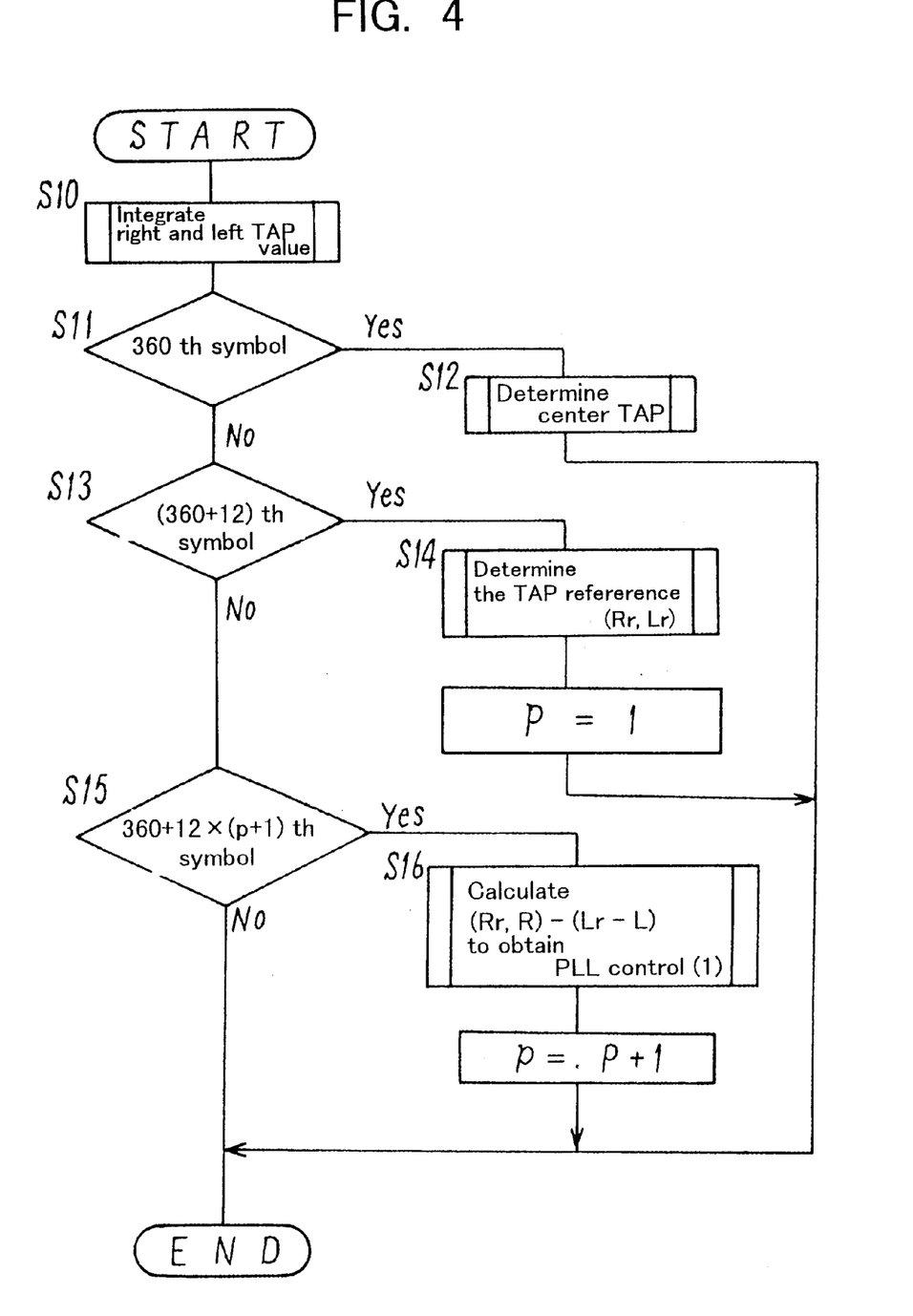
FIG. 4 is a flowchart showing a tap PLL process shown in FIG. 3.
Figure 5:
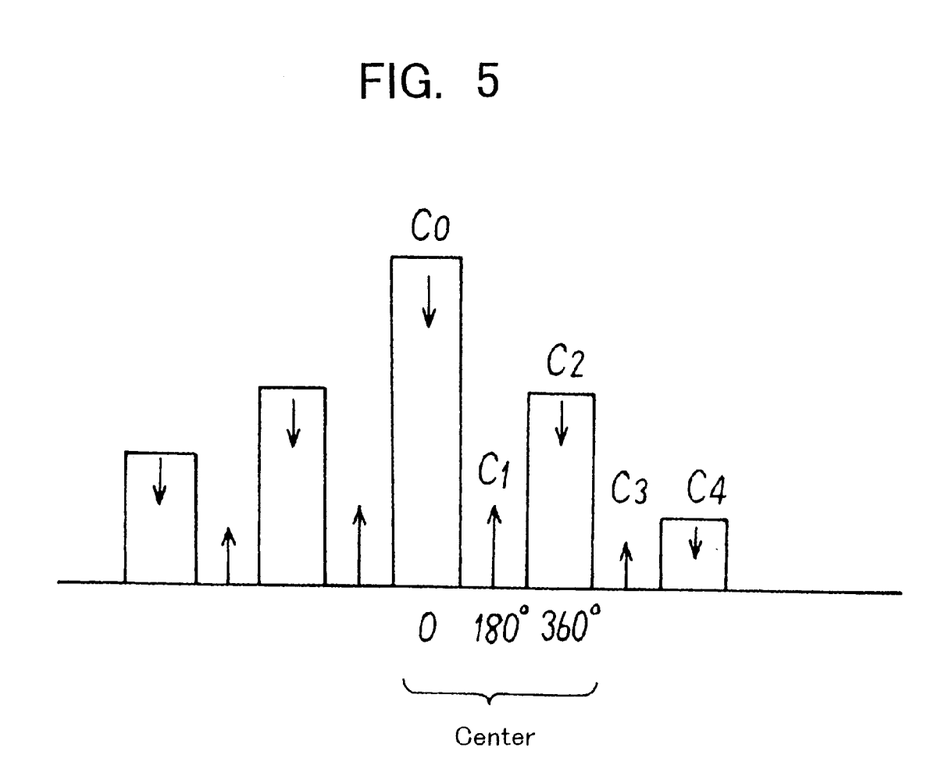
FIG. 5 is an explanatory diagram showing a center tap shown in FIG. 4.

FIG. 3 is a flowchart showing a PLL control process in one embodiment of the present invention. FIG. 4 is a flowchart showing a tap PLL process. FIG. 5 is an explanatory diagram showing how the center tap is determined. FIG.

Figure 6:
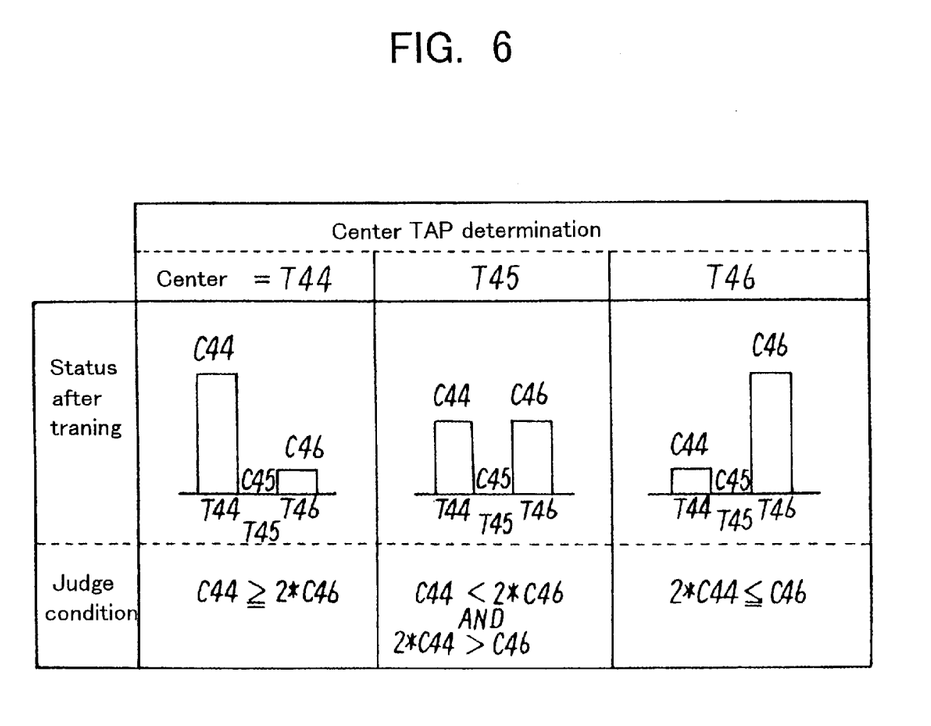
FIG. 6 is an explanatory diagram showing a center tap determining process shown in FIG. 4.
Figure 7:
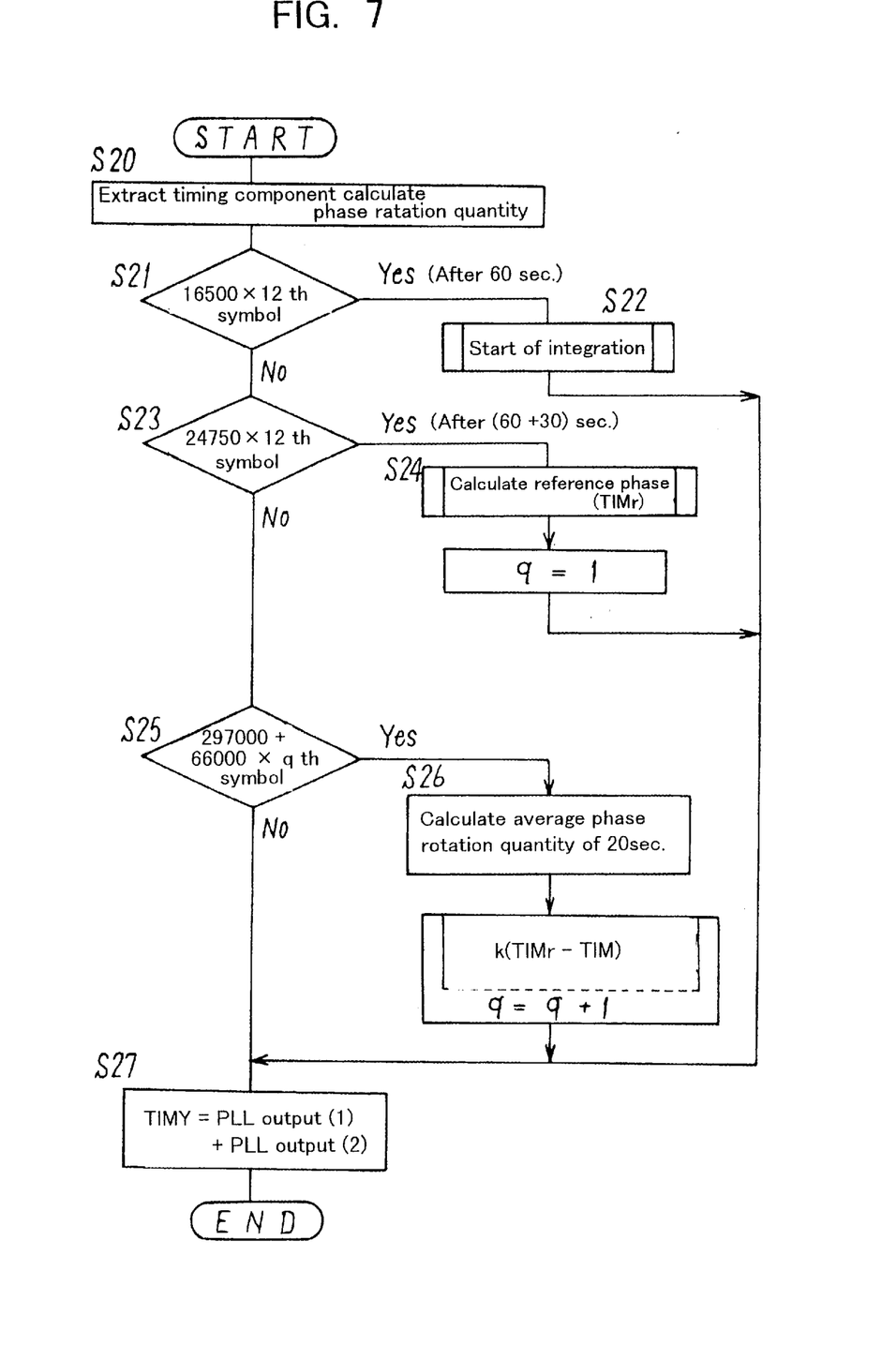
FIG. 7 is a flowchart showing a phase compensation process shown in FIG. 3.
Figure 8:
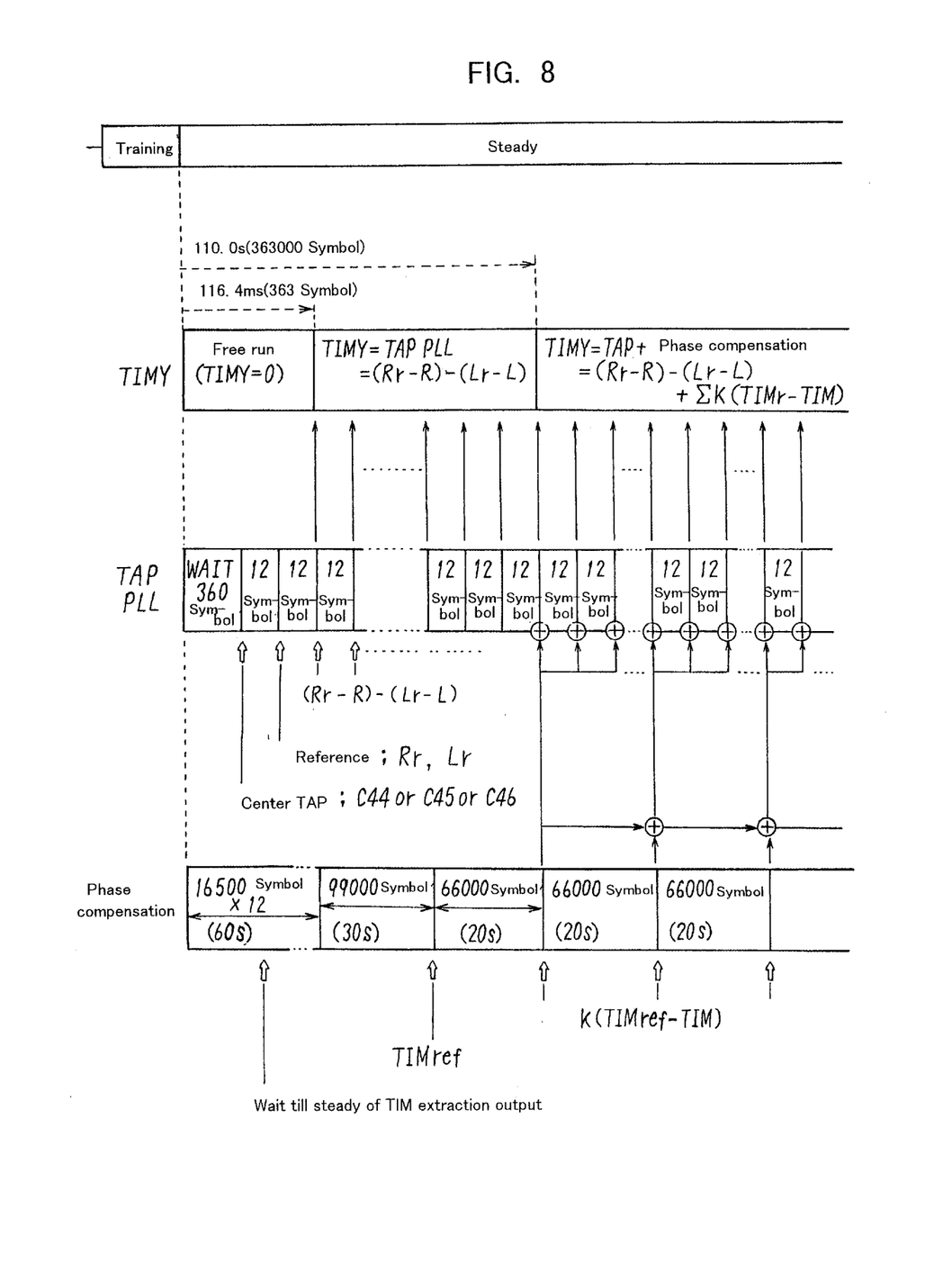
FIG. 8 is an explanatory diagram showing a PLL control sequence shown in FIG. 3.

6 is an explanatory diagram showing a center tap determining process in FIG. 4. FIG. 7 is a flowchart showing a phase compensation process. FIG. 8 is an explanatory diagram showing a PLL control sequence in FIG. 3.

The entire PLL control process in FIG. 3 is explained referring to FIG. 3.

(S1) it is judged whether during a training period or during a steady-state period.

(S2) If during the training period, a timing component, which can be accurately extracted from a training signal, is therefore extracted from the training signal. Then, the phase rotational quantity is calculated from the extracted timing component. The PLL control input is calculated corresponding to the phase rotational quantity. The processing proceeds to step S5.

(S3) Whereas if not during the training period, it must be the steady-state period (a data transmission period). In this case, a timing training process utilizing the training signal becomes difficult. Therefore, the tap PLL process of creating the PLL control input (1) is executed using the tap coefficients of the auto equalization unit 5. This process is described with reference to the Figures from FIG. 4 onwards.

(S4) Next, for compensating a long-period phase shift, the PLL control input (2) is created using a timing phase extraction output, and a phase error is corrected. This process is described referring to FIG. 7.

(S5) the timing PLL unit 8 is PLL-controlled based on the created PLL control input.

Next, the tap PLL process in FIG. 3 is explained referring mainly to FIG. 4. Note that the explanation might involve referring also to FIGS. 5, 6 and 8.

(S10) A tap right-and-left difference extracting unit 9 of the DSP 20 integrates values of the right and left taps of the auto equalization unit 5. Namely, as described above, the extracting unit 9 detects the tap coefficients CR1–CRn of the right taps 61–6n on the basis of the center tap and the tap coefficients CL1–CLm of the left taps 50–5m, and stores these coefficients.

(S11) The DSP 20 judges whether or not a 360th symbol from the beginning of the steady-state period (from an end of training) is reached. The DSP 20, if not the 360th symbol, advances to step S13.

(S12) while on the other hand, the DSP 20, when judging that the 360th symbol is reached (see FIG. 8), anterior to the PLL control, determines the center tap of the auto equalization unit 5. If the position of the center tap is not accurate, it is impossible to precisely detect the right taps and the left taps of the auto equalization unit 5. Hence, there might occur an error in the PLL control signal using the right and left tap coefficients of the auto equalization unit 5. It is therefore required that the position of the center tap of the auto equalization unit 5 be precisely detected.

The center tap may be defined as a tap of which the tap coefficient grows most in the steady state, and its tap position can be predicted from a design of the auto equalization unit 5. In the case of the line via a carrier link and of the non-Nyquist transmission, however, the timing extract becomes difficult, an error might occur in some cases when in the timing training process during the training. Even if the phase error occurs, the auto equalization unit 5 executes sampling at a velocity which is twice as high as a symbol rate in order to enable the training to be done, and implements the equalization.

In this case, since the taps of the auto equalization unit 5 grow in a phase-shifted state, the position of the center tap shifts. As shown in FIG. 5, if sampled at the velocity that is twice the symbol rate, the taps of the auto equalization unit 5 turn out to be taps disposed at 180° phase interval with respect to each other. When in the lead-in process, only the tap coefficients of the taps C0, C2, C4 at an interval of 360°, i.e., at every symbol rate.

Then, the tap coefficients of the 180° phase taps C1, C3 grow in the steady state, and the values of the tap coefficients of the 360° phase taps C0, C2 decrease. In such a case, if the tap coefficients of the auto equalization unit grow in a state where the phase shifts due to the above-described phase error, the position of the center tap shifts. In order to detect the shifted position of the center tap, such a center tap position that the tap coefficient is maximized in the steady state, is determined based on a value of the tap coefficient just after being training.

As shown in FIG. 6, candidate taps are taps T44, T45, T46 in the vicinity of the design center tap. The taps T44, T46 are defined as 360° phase taps, and the tap T45 is a 180° phase tap. These taps are disposed adjacent to each other. Tap coefficients C44–C46 of these taps T44–T46 are compared in their magnitude, and any one of these taps is determined as the center tap.

Namely, the tap coefficient C44 of the tap T44 is compared with the tap coefficient C46 of the tap T46. When the tap coefficient C44 is greater than or equal to twice the tap coefficient C46 (when $C44 \geq 2 \cdot C46$), the tap T44 having the tap coefficient C44 is determined as the center tap. In this case, the tap coefficient C44 of the tap T44 grows at the maximum.

When the tap coefficient C46 is greater than or equal to twice the tap coefficient C44 (when $C46 \geq 2 \cdot C44$), the tap T46 having the tap coefficient C46 is determined as the center tap.

When the tap coefficient C44 is less than twice the tap coefficient C46 as well as being less than twice the tap coefficient C44 ($C44<2 \cdot C46$, and $2 \cdot C44>C46$), it is judged that the tap coefficient C45 of the tap T45 grows at the maximum, and the tap T45 having the tap coefficient C45 is determined as the center tap.

Thus, the position of the center tap is judged, and the center-tap determination processing comes to an end.

(S13) The DSP 20 judges whether or not the signal is the 372nd (360+12) symbol from the beginning of the steady state. If not the 372nd symbol from the beginning of the steady state, the DSP 20 advance to step S15.

(S14) If it is reached the 372th symbol from the beginning of the steady state, (see FIG. 8), the reference value of the tap sum is to be determined. To be specific, the tap coefficients CR1–CRn of the right taps 61–6n based on the center tap determined in step S12 are detected, and the first sum ΣCRn of the tap coefficients CR1–CRn is calculated. Similarly, the tap coefficients CL1–CLm of the left taps 50–5m are detected, and the second sum ΣCLm of the tap coefficients CL1–CLm is calculated. Then, the memory 10 is stored with the first sum ΣCRn as a right-side reference value Rr and the second sum ·CLm as a left-side reference value Lr. Subsequently, a pointer p is set to "1", and the processing is finished.

(S15) The DSP 20 judges whether or not the signal is the 360+12 (p+1)th symbol from the beginning of the steady state. If not the 360+12 (p+1)th symbol from the beginning of the steady state, the processing is ended.

(S16) If the 360+12 (p+1)th symbol from the beginning of the steady state is reached (see FIG. 8), the PLL output (the PLL control signal) (1) is calculated. Namely, the tap coefficients CR1–CRn of the right taps 61–6n based on the center tap determined in step S12 are detected, and the first sum ΣCRn (=R) of the tap coefficients CR1–CRn is calculated. Similarly, the tap coefficients CL1–CLm of the left taps 50–5m are detected, and the second sum ΣCLm (=L) of the tap coefficients CL1–CLm is calculated.

Then, the DSP 20 calculates a first difference (=Rr−R) between the right-side reference value Rr and the first sum R, and a second difference (=Lr−L) between the left-side reference value Lr and the second sum L. Further, the DSP 20 calculates a difference (=Rr−R)−(Lr−L)) between the first difference (Rr−R) and the second difference (Lr−L). Then, this difference is set as the PLL output (the control signal) (1).

Accordingly, the PLL control signal (1) is expressed by the following equation.

$$\text{PLL Control Signal (1)}=(Rr-R)-(Lr-L) \quad (1)$$

Moreover, the pointer p is updated to [p+1], and the processing is finished.

Thus, as shown in FIG. 8, the center tap is determined at the 360th immediately after training, and thereafter the reference value of the tap sum is determined based on the sum of the right and left tap coefficients of the auto equalization unit 5. From this process onward, the sum ·CRn of the right tap coefficients and the sum ·CLm of the left tap coefficients at that point of time are calculated at an interval of 12symbols, and the first and second differences from the respective reference values are calculated. Then, a difference between the first and second differences is calculated, thereby obtaining the PLL control signal (1).

In the manner described above, the respective sums of the tap coefficients of the auto equalization unit immediately after training are stored as the reference values, and the difference between the sums of the right and left tap coefficients is set as a control quantity. It is therefore feasible to effect the control to the state of the tap coefficient at the point of time of being led in. Hence, there can be locked to the training phase irrespectively of the line characteristic. Accordingly, it is possible to prevent the phase shift and the phase-shifted state as well due to the line characteristic.

Further, the determination of the center tap of the auto equalization unit 5 after the training is made before the PLL control on the basis of the tap coefficient immediately after training, and hence, even if the phase shift is caused, the precise position of the center tap can be judged. It is therefore feasible to accurately calculate the control quantity using the right and left tap coefficients.

Next, a phase compensation process is described. The phase compensation process is executed for compensating the PLL control using the tap coefficients. In the PLL control using the tap coefficients, the phase shift occurs little by little for a long period of time. This might result in a decline of quality of the regenerated data. For compensating this phase shift, the phase error is corrected by use of the timing phase extraction output.

In the non-Nyquist transmission, the timing phase extraction output is unstable and has a large jitter. Therefore, the timing extraction outputs are integrated for a fixed time, and an average value thereof is obtained. Moreover, the average value of the timing phases immediately after training is stored as the reference phase, and a difference from an average value of the subsequent timing phases is set as a phase error.

The phase compensation process is explained referring to FIG. 7. Incidentally, this explanation involves the use of FIG. 8.

(S20) A timing extraction/phase rotation unit 6 of the DSP 20 extracts a timing component from an output of the demodulation unit 2, and calculates a phase rotational quantity.

(S21) The DSP judges whether or not a 16500×12 (198000)th symbol (after an elapse of 60 sec) from the beginning of the steady state is reached. The DSP 20, if not the 198000th symbol, advances to step S23.

(S22) While on the other hand, the DSP 20, when judging that the 198000th symbol (after the elapse of 60 sec) is reached (see FIG. 8), starts an integrating operation of the calculated phase rotational quantity. Then, the processing comes to an end.

(S23) The DSP 20 judges whether or not a 24750×12 (297000)th symbol (after an elapse of 90 sec) from the beginning of the steady state is reached. If not the 297000th symbol from the beginning of the steady state, the processing proceeds to step S25.

(S24) When the 297000th symbol from the beginning of the steady state is reached (see FIG. 8), a reference phase (TIMr) is calculated. Namely, an average value of the 30-sec phase rotational quantities integrated in step S22 is calculated and stored as the reference phase TIMr. Then, the pointer q is set to "1", and the processing is finished.

(S25) The DSP 20 judges whether or not a (297000+ 66000×q)th symbol from the beginning of the steady state is reached. If not the (297000+66000×q)th symbol from the beginning of the steady state, the DSP 20 advances to step S27.

(S26) When the (297000+66000×q)th symbol from the beginning of the steady state is reached (see FIG. 8), a PLL output (a PLL control signal) (2) is calculated. To be specific, there is calculated an average value TIM of 20-sec phase rotational quantities calculated in step S20 and integrated in step S22. Then, the phase error extraction unit 11 of the DSP 20 subtracts the average value TIM detected from the reference phase TIMr, multiplies it by a coefficient k, then effect the integration, thereby obtaining the PLL control signal (2).

Accordingly, the PLL control signal (2) is expressed by the following formula.

$$\text{PLL Control Signal (2)}=\Sigma k\,(TIMr-TIM) \quad (2)$$

where k is the coefficient for making control power of the PLL control input (1) coincident with control power of the phase error correction.

Further, the pointer q is updated to [q+1], and the processing proceeds to step S27.

(S27) The adding unit 12 of the DSP 20 adds the PLL control signal (1) to the PLL control signal (2), thereby obtaining a final PLL control input TIMY. Accordingly, the PLL control input TIMY is given by:

$$TIMY=PLL\text{ Control Signal (1)}+PLL\text{ Control Signal (2)} \quad (3)$$

Thus, as shown in FIG. 8, there must be a 60-sec wait after the steady state and also a wait untill the timing extraction output is stabilized. Thereafter, the integration for detecting the reference phase is started. The reference phase is obtained by taking an average value of the 30-sec phase rotational quantities. From this process onwards, an average value of the 20-sec phase rotational quantities is calculated at an interval of 20 sec, and an error thereof is calculated, thereby obtaining the PLL control input (2).

Thus, even if the timing phase extraction output is unstable and has the jitter, since the average value of the phase rotational quantities for the fixed time is taken, the timing phase can be precisely obtained.

As shown in FIG. 8, the PLL control input TIMY remains to be zero up to the 384th symbol (116.4 ms) from the beginning of the steady state after the end of training. Accordingly, the timing PLL unit 8 runs by itself with the phase training at the training time, during which the center tap of the auto equalization unit 5 is determined as well as determining the reference values Rr, Lr of the tap coefficients.

Then, with an elapse of the 384th symbol, the PLL control input TIMY is calculated at the interval of 12 symbols on the basis the differences (Rr−R)−(Lr−L) between the reference values and the sums of the right and left taps. The timing PLL unit 8 is controlled based on this tap PLL control input.

Further, with an elapse of 363000th symbol, an error between the reference phase TIMr and the average value TIM is calculated at an interval of 66000 symbols, thereby obtaining an integrated value ·k (TIMr−TIM). Then, the PLL control input becomes a sum of the tap PLL control input and the phase compensation PLL control input [(Rr−R)−(Lr−L)+Σk (TIMr−TIM)].

The PLL control using the tap coefficients is thus implemented based on the phase when training. Therefore, it is feasible to prevent a phenomenon where the phase transiently shifted, and the stable data transmission can be attained immediately after training.

Further, the long-lasting and slow phase error due to a slight error of the PLL control in the tap coefficients, is corrected by averaging the timing phase extraction outputs. Therefore, it is possible to attain the PLL control under which a large proportion of the phase error is restrained.

In addition to the embodiment discussed above, the present invention may be modified as follows.

(1) The MODEM has been exemplified as the data receiving device including the auto equalization unit in the embodiment discussed above, however, the present invention is applicable to other types of data receiving apparatus.

(2) The center tap is determined under the tap PLL control, however, this determining process may not be executed.

(3) The phase compensation process is added, however, the phase compensation process may be excluded.

The present invention has been described so far by way of the embodiments but may be modified in a variety of forms within the range of the gist of the present invention, and these modifications may not be excluded from the scope of the present invention.

As discussed above, the present invention exhibits the effects which follow.

(1) The sum of the right-side tap coefficients and the sum of the left-side tap coefficients immediately after training, are stored as the right- and left-side reference values, and the PLL control is carried out so that the difference with respect to the reference value becomes zero. It is therefore feasible to set in phase precisely when training even if there is a scatter in terms of the line characteristic.

(2) Further, because of the PLL control to the reference value immediately after training, it is feasible to prevent the transiently shifted-state just after training, and the stable data transmission can be carried out immediately after training.

What is claimed is:

1. A PLL control method in a data receiving apparatus including an auto equalization unit for automatically equalizing a demodulated receiving signal, said method comprising:

a step of training in a timing phase of a PLL in accordance with a training signal;

a step of obtaining, after training, a right-side reference value from a sum of tap coefficients of taps on the right side of a center tap of said auto equalization unit, and obtaining a left-side reference value from a sum of tap coefficients of taps on the left side of the center tap of said auto equalization unit;

a step of calculating, after obtaining the two reference values, a first sum of the tap coefficients of the taps on the right side of the center tap of said auto equalization unit, thereafter calculating a first difference between the first sum and the right-side reference value, calculating a second sum of the tap coefficients of the taps on the left side of the center tap of said auto equalization unit, and thereafter obtaining a second difference between the second sum and the left-side reference value; and a step of obtaining a PLL control signal by obtaining a difference between the first and second differences.

2. A PLL control method in a data receiving apparatus according to claim 1, wherein said step of executing the training includes a step of extracting a timing component of the training signal, and thereafter calculating a phase rotational quantity of the timing component.

3. A PLL control method in a data receiving apparatus according to claim 1, wherein said step of obtaining the reference values includes a step of storing the obtained right- and left-side reference values.

4. A PLL control method in a data receiving apparatus according to claim 1, further comprising a step of determining, after training, the center tap of said auto equalization unit in accordance with values of the tap coefficients of the taps of said auto equalization unit.

5. A PLL control method in a data receiving apparatus according to claim 1, further comprising:

a step of obtaining, after training, a timing reference value from a phase of the timing component regenerated from the receiving signal;

a step of obtaining a third difference between an average value of the phase of the timing component regenerated from the receiving signal and the timing reference value; and a step of obtaining the PLL control signal by adding the third reference to the difference between the first and second differences.

6. A PLL control method in a data receiving apparatus including an auto equalization unit for automatically equalizing a demodulated receiving signal, said method comprising:

a step of obtaining, after training, a right-side reference value from a sum of tap coefficients of taps on the right side of a center tap of said auto equalization unit, and obtaining a left-side reference value from a sum of tap coefficients of taps on the left side of the center tap of said auto equalization unit;

a step of calculating, after obtaining the two reference values, a first sum of the tap coefficients of the taps on the right side of the center tap of said auto equalization unit, thereafter calculating a first difference between the first sum and the right-side reference value, calculating a second sum of the tap coefficients of the taps on the left side of the center tap of said auto equalization unit, and thereafter obtaining a second difference between the second sum and the left-side reference value; and a step of obtaining a PLL control signal by obtaining a difference between the first and second differences.

7. A data receiving method comprising:

a step of demodulating a received signal;

a step of automatically equalizing the demodulated receiving signal with an equalizer having a plurality of taps;

a step of obtaining, after training, a right-side reference value from a sum of tap coefficients of taps on the right side of a center tap of said auto equalization unit, and obtaining a left-side reference value from a sum of tap coefficients of taps on the left side of the center tap of said auto equalization unit;

a step of calculating, after obtaining the two reference values, a first sum of the tap coefficients of the taps on the right side of the center tap of said auto equalization unit, thereafter calculating a first difference between the first sum and the right-side reference value, calculating a second sum of the tap coefficients of the taps on the left side of the center tap of said auto equalization unit, and thereafter obtaining a second difference between the second sum and the left-side reference value; and a step of obtaining a PLL control signal by obtaining a difference between the first and second differences.

8. A data receiving apparatus comprising:

a first processing unit for sampling a received signal with a sampling signal from a PLL; and a second processing unit for demodulating the sampled received signal and automatically equalizing the demodulated received signal with an equalizer having a plurality of taps;

and wherein said second processing unit trains in a timing phase of said PLL in accordance with a training signal, obtains a right-side reference value from a sum of tap coefficients of the taps on the right side of a center tap of said auto equalization unit, obtains a left-side reference value from a sum of tap coefficients of the taps on the left side of the center tap of said auto equalization unit, calculates a first sum of the tap coefficients of the taps on the right side of the center tap of said auto equalization unit, thereafter calculates a first difference between the first sum and the right-side reference value, calculates a second sum of the tap coefficients of the taps on the left side of the center tap of said auto equalization unit, and thereafter obtains a second difference between the second sum and the left-side reference value, and obtains a PLL control signal by obtaining a difference between the first and second differences.

9. A PLL control method in a data receiving apparatus including an auto equalization unit for automatically equalizing a demodulated receiving signal, said method comprising:

a step of training in a timing phase of a PLL in accordance with a training signal;

a step of calculating a first sum of tap coefficients of taps on the right side of a determined center tap of said auto equalization unit;

a step of calculating a second sum of tap coefficients of taps on the left side of the determined center tap of said auto equalization unit;

a step of calculating a timing reference value from a phase of a timing component regenerated from the received signal;

a step of calculating a second difference between an average value of the phase of the timing component regenerated from the receiving signal and the timing reference value; and a step of obtaining a PLL control signal based on a difference between the first sum and the second sum and said second difference.

10. A data receiving method comprising:

a step of demodulating a received signal;

a step of automatically equalizing the demodulated receiving signal with an equalizer having a plurality of taps;

a step of training in a timing phase of a PLL in accordance with a training signal;

a step of calculating a first sum of tap coefficients of taps on the right side of a determined center tap of said auto equalization unit;

a step of calculating a second sum of tap coefficients of taps on the left side of the determined center tap of said auto equalization unit;

a step of calculating a timing reference value from a phase of a timing component regenerated from the received signal;

a step of calculating a second difference between an average value of the phase of the timing component regenerated from the receiving signal and the timing reference value; and a step of obtaining a PLL control signal based on a difference between the first sum and the second sum and said second difference.

11. A data receiving apparatus comprising:

a first processing unit for sampling a received signal with a sampling signal from a PLL; and a second processing unit for demodulating the sampled received signal and automatically equalizing the demodulated received signal with an equalizer having a plurality of taps;

and wherein said second processing unit trains in a timing phase of said PLL in accordance with a training signal, calculates a first sum of tap coefficients of taps on the right side of said determined center tap of said auto equalization unit and a second sum of tap coefficients of taps on the left side of the determined center tap of said auto equalization unit, calculates a timing reference value from a phase of a timing component regenerated from the received signal, calculates a second difference between an average value of the phase of the timing component regenerated from the receiving signal and the timing reference value, and obtains a PLL control signal based on a difference between the first sum and the second sum and said second difference.

* * * * *